United States Patent
Tsubouchi

(10) Patent No.: US 10,748,631 B2
(45) Date of Patent: Aug. 18, 2020

(54) SEMICONDUCTOR MEMORY DEVICE

(71) Applicant: TOSHIBA MEMORY CORPORATION, Tokyo (JP)

(72) Inventor: Hiroshi Tsubouchi, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/108,810

(22) Filed: Aug. 22, 2018

(65) Prior Publication Data
US 2019/0198126 A1 Jun. 27, 2019

(30) Foreign Application Priority Data
Dec. 27, 2017 (JP) .................. 2017-252186

(51) Int. Cl.
*G11C 16/04* (2006.01)
*G11C 16/34* (2006.01)
*H01L 27/11556* (2017.01)
*H01L 27/11582* (2017.01)
*G11C 16/26* (2006.01)
*G11C 16/10* (2006.01)
*G11C 16/08* (2006.01)

(52) U.S. Cl.
CPC ...... *G11C 16/3459* (2013.01); *G11C 16/0483* (2013.01); *G11C 16/08* (2013.01); *G11C 16/10* (2013.01); *G11C 16/26* (2013.01); *H01L 27/11556* (2013.01); *H01L 27/11582* (2013.01)

(58) Field of Classification Search
CPC . G11C 16/3459; G11C 16/0483; G11C 16/08; G11C 16/10; G11C 16/26

USPC ..................................................... 365/185.17
See application file for complete search history.

(56) References Cited

U.S. PATENT DOCUMENTS

| 7,468,924 | B2 | 12/2008 | Kwon |
| 9,269,445 | B1 | 2/2016 | Abe et al. |
| 9,564,213 | B2 | 2/2017 | Sun et al. |
| 9,607,707 | B1 | 3/2017 | Pang et al. |
| 9,672,916 | B2 | 6/2017 | Zhang et al. |
| 2009/0103365 | A1 | 4/2009 | Roohparvar et al. |

(Continued)

FOREIGN PATENT DOCUMENTS

| JP | 2016062624 A | 4/2016 |
| JP | 2016152052 A | 8/2016 |

(Continued)

*Primary Examiner* — Huan Hoang
(74) *Attorney, Agent, or Firm* — Kim & Stewart LLP

(57) ABSTRACT

A semiconductor memory device includes a memory string with a first selection transistor, a first memory cell, a second memory cell, and a second selection transistor connected in series. A first word line connects to the first memory cell, and a second word line connects to the second memory cell. Selection gates line are connected to first and second selection transistors. A control circuit is configured to control a write operation on the first memory string. The write operation includes a program loop with a program operation and a program verification operation. After the program loop is completed, a first voltage is applied to the first and second word lines and a second voltage is applied to the selection gate lines. The first voltage is sufficient to turn on the first and second memory cells. The second voltage is sufficient to turn on the selection transistors.

16 Claims, 9 Drawing Sheets

(56) References Cited

U.S. PATENT DOCUMENTS

2016/0240264 A1    8/2016  Hosono
2018/0218774 A1*   8/2018  Kimura .................. G11C 16/10
2019/0096488 A1*   3/2019  Joe ........................ G11C 16/10

FOREIGN PATENT DOCUMENTS

WO    2009051960 A1    4/2009
WO    2016089467 A1    6/2016
WO    2016137545 A1    9/2016

* cited by examiner

US 10,748,631 B2

SEMICONDUCTOR MEMORY DEVICE

CROSS-REFERENCE TO RELATED APPLICATION

This application is based upon and claims the benefit of priority from Japanese Patent Application No. 2017-252186, filed Dec. 27, 2017, the entire contents of which are incorporated herein by reference.

FIELD

Embodiments described herein relate generally to a semiconductor memory device.

BACKGROUND

An NAND flash memory is a known semiconductor memory device.

DETAILED DESCRIPTION

Figure 1:
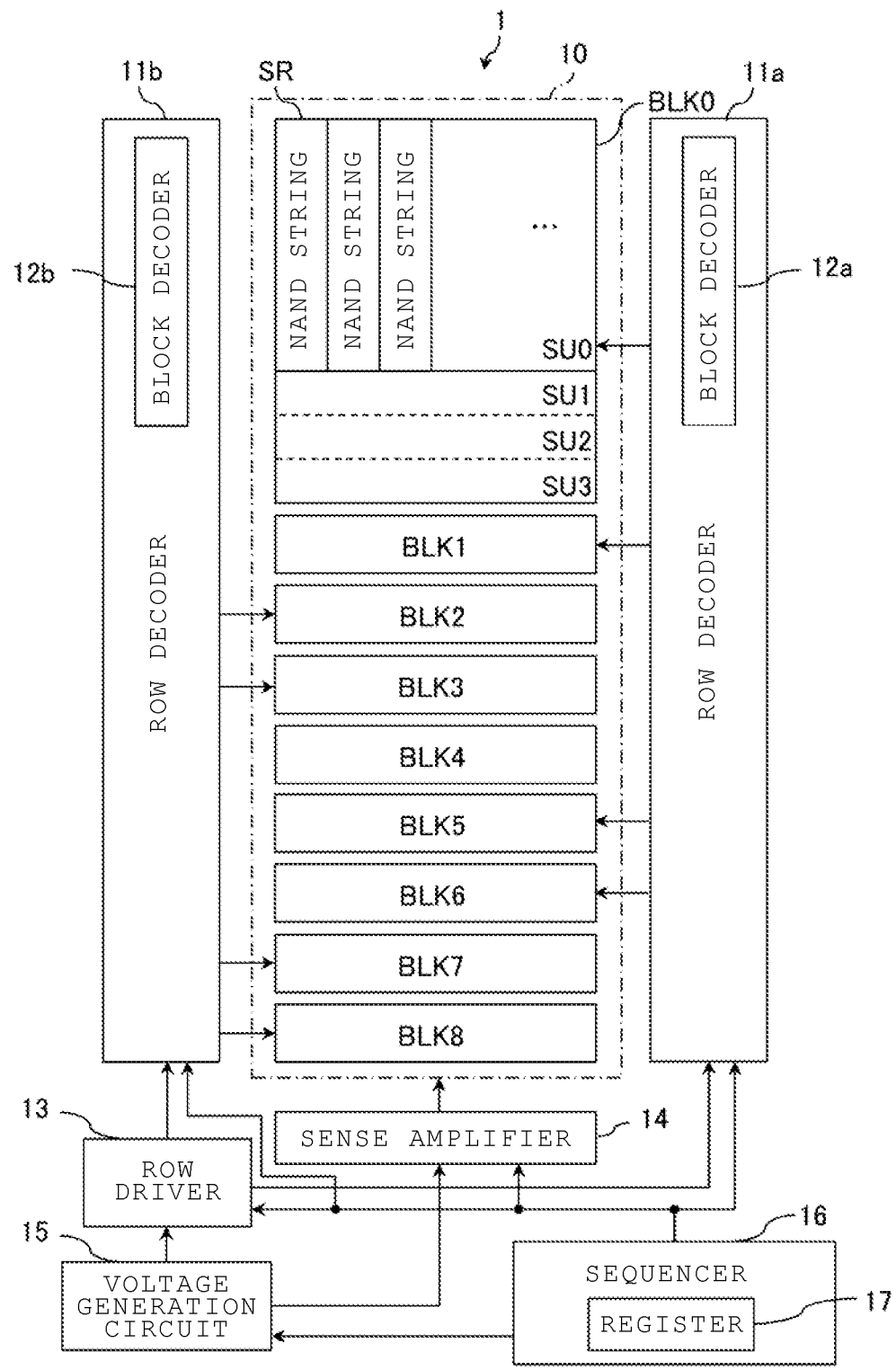
FIG. 1 is a block diagram of a semiconductor memory device according to a first embodiment.

In general, according to one embodiment, a semiconductor memory device includes a first memory string including a first selection transistor, a first memory cell, a second memory cell, and a second selection transistor connected in series. A first word line is connected to a gate of the first memory cell. A second word line is connected to a gate of the second memory cell. A first selection gate line is connected to a gate of the first selection transistor. A second selection gate line is connected to a gate of the second selection transistor. A control circuit is configured to control a write operation on the first memory string. The write operation includes a program loop that includes a program operation and a program verification operation performed on the first memory cell. After the program loop is completed, a first voltage is applied to the first and second word lines and a second voltage is applied to the first and second selection gate lines. The first voltage is sufficient to turn on the first and second memory cells. The second voltage is sufficient to turn on the first and second selection transistors.

Example embodiments will be described below with reference to the drawings. In this description, the same components/aspects are denoted by the same reference numerals through all drawings.

1. First Embodiment

A semiconductor memory device according to a first embodiment will be described. In the following description, a three-dimensional stacked NAND flash memory is presented as one example of a semiconductor memory device in which memory cell transistors are three-dimensionally stacked on a semiconductor substrate. However, the present disclosure is applicable not only to the three-dimensional stacked NAND flash memory but also to other semiconductor memory device such as to planar NAND flash memory having memory cell transistors disposed on a semiconductor substrate.

1.1 Configuration

1.1.1 Overall Configuration of Semiconductor Memory Device

First, an overall configuration of a semiconductor memory device will be described with reference to FIG. 1. In FIG. 1, a part of the connection of each block is indicated by an arrow, but the connection may be indicated by other manners.

As illustrated in FIG. 1, a semiconductor memory device 1 includes a memory cell array 10, row decoders 11 (11a and 11b), a row driver 13, a sense amplifier 14, a voltage generation circuit 15, and a sequencer 16.

The memory cell array 10 includes eight blocks BLK (BLK0 to BLK7) which are a grouping of nonvolatile memory cell transistors. Each of the blocks BLK includes four string units SU (SU0 to SU3) which a grouping of NAND strings SR in which memory cell transistors are connected in series. The number of blocks BLK in the memory cell array 10 and the number of the string units SU in each block BLK are arbitrary.

The row decoder 11a is provided for the blocks BLK0, BLK1, BLK5, and BLK6. The row decoder 11b is provided for the blocks BLK2, BLK3, BLK6, and BLK7. The row decoders 11a and 11b include block decoders 12a and 12b, respectively. The block decoders 12a and 12b decode a row address RA, and select a row of the corresponding block BLK based on the decoding result. Then, the row decoders 11a and 11b output a necessary voltage to the corresponding block BLK.

The row driver 13 supplies a voltage necessary for writing, reading, and erasing of data to the row decoders 11a and 11b.

The sense amplifier 14 senses the data read out from the memory cell transistors at the time of reading of data. In addition, the sense amplifier 14 transmits write data to the memory cell transistors at the time of writing of data.

The voltage generation circuit 15 generates a voltage necessary for writing, reading, and erasing of data, and supplies the voltage to the row driver 13 and the sense amplifier 14, for example.

The sequencer 16 controls an overall operation of the semiconductor memory device 1. More specifically, the sequencer 16 controls the row decoders 11a and 11b, the row driver 13, the sense amplifier 14, and the voltage generation circuit 15. Further, the sequencer 16 includes a register 17 therein. The register 17 stores various operation settings and the like. In particular, the register 17 retains parameters for selecting whether to execute a dummy read after a write operation. For example, the sequencer 16 does not execute a dummy read after a write operation (dummy read="disable") when a register address corresponding to the dummy read of the register 17 is set to "0". In addition, the sequencer 16 executes a dummy read after a write operation (dummy read="enable") when the register address corresponding to the dummy read of the register 17 is set to "1". The setting of the parameters corresponding to the enable/disable of the dummy read is performed at the time of product shipment, for example.

1.1.2 Configuration of Memory Cell Array

Figure 2:
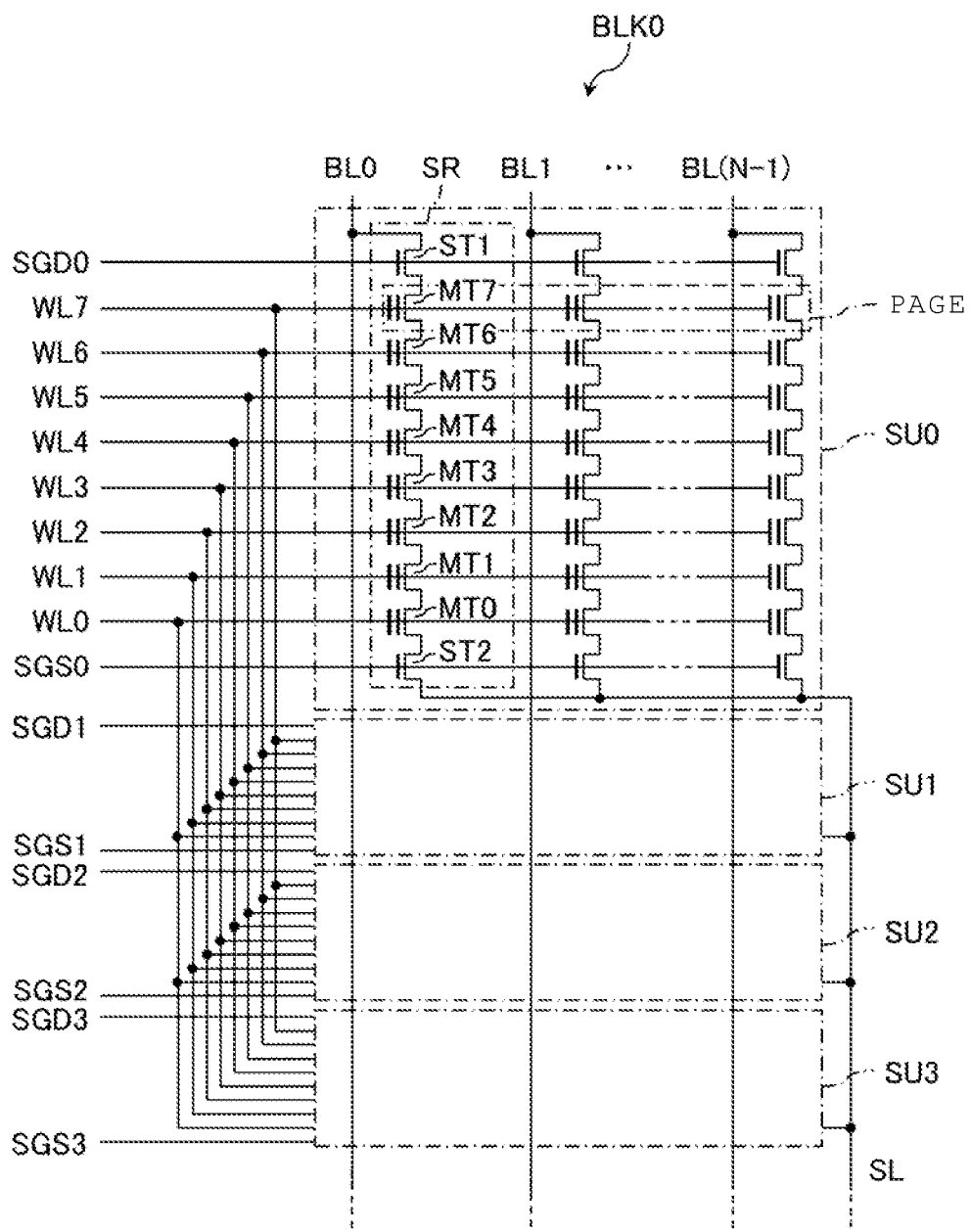
FIG. 2 is a circuit diagram of a memory cell array provided in the semiconductor memory device according to the first embodiment.

A configuration of the memory cell array 10 will be described with reference to FIG. 2. In FIG. 2, a configuration of the block BLK0 is illustrated, but a configuration of the blocks BLK1 to BLK8 is also the same as that of the block BLK0.

As illustrated in FIG. 2, each of the NAND strings SR includes, for example, eight memory cell transistors MT (MT0 to MT7) and selection transistors ST1 and ST2. Each of the memory cell transistors MT includes a control gate and a charge storage layer, and retains data in a nonvolatile state. The memory cell transistor MT can retain data of 1 bit or more.

The memory cell transistor MT may be a MONOS type in which an insulating film is used for the charge storage layer, or a FG (floating gate) type in which a conductive layer is used for the charge storage layer. Hereinafter, the MONOS type will be described as an example. Further, the number of memory cell transistors MT is not limited to eight, but may be, for example, 16, 32, 64, 96, or 128. The number of memory cell transistors is not limited to these numbers. In addition, the number of selection transistors ST1 and ST2 is arbitrary, and may each be one or more, respectively.

The eight memory cell transistors MT are connected to in series with each other between a source of the selection transistor ST1 and a drain of the selection transistor ST2. More specifically, the memory cell transistors MT0 to MT7 have a current path connected in series. A drain of the memory cell transistor MT7 is connected to the source of the selection transistor ST1, and a source of the memory cell transistor MT0 is connected to the drain of the selection transistor ST2.

In the string units SU0 to SU3, gates of the selection transistors ST1 are connected to selection gate lines SGD0 to SGD3, respectively. Similarly, gates of the selection transistors ST2 in the string units SU0 to SU3 are connected to selection gate lines SGS0 to SGS3, respectively. Hereinafter, the selection gate lines SGD0 to SGD3 can be referred to as a selection gate line SGD it is unnecessary to distinguish between these elements. The selection gate lines SGS0 to SGS3 are referred to as a selection gate line SGS, unless otherwise specified. In each of the string units SU, the selection gate lines SGS0 to SGS3 may be connected in common.

The control gates of the memory cell transistors MT0 to MT7 in the block BLK are respectively connected to word lines WL0 to WL7 in common. Hereinafter, the word lines WL0 to WL7 are referred to as a word line WL, unless otherwise specified.

Drains of the selection transistors ST1 of the NAND strings SR in the string units SU are connected to different bit lines BL0 to BL(N−1) (N is an integer of 2 or greater). Hereinafter, the bit lines BL0 to BL(N−1) are referred to as a bit line BL, unless otherwise specified. The respective bit lines BL are connected to one NAND string SR in the respective string units SU among the plurality of blocks BLK in common. In addition, sources of the plurality of selection transistors ST2 are connected to a source line SL in common. That is, the string unit SU is a set of the NAND strings SR that are connected to different bit lines BL and the same selection gate lines SGD and SGS. Further, the block BLK is a set of the plurality of string units SU having a common word line WL. The memory cell array 10 is a set of the plurality of blocks BLK having a common bit line BL.

The writing and reading of data are collectively performed on the memory cell transistor MT connected to any one of the word lines WL in any of the string units SU. Hereinafter, a group of 1-bit data to be written into or read from each of the memory cell transistors MT collectively selected at the time of writing and reading of data is referred to as a "page".

1.1.3 Configuration of Memory Cell Array

Figure 3:
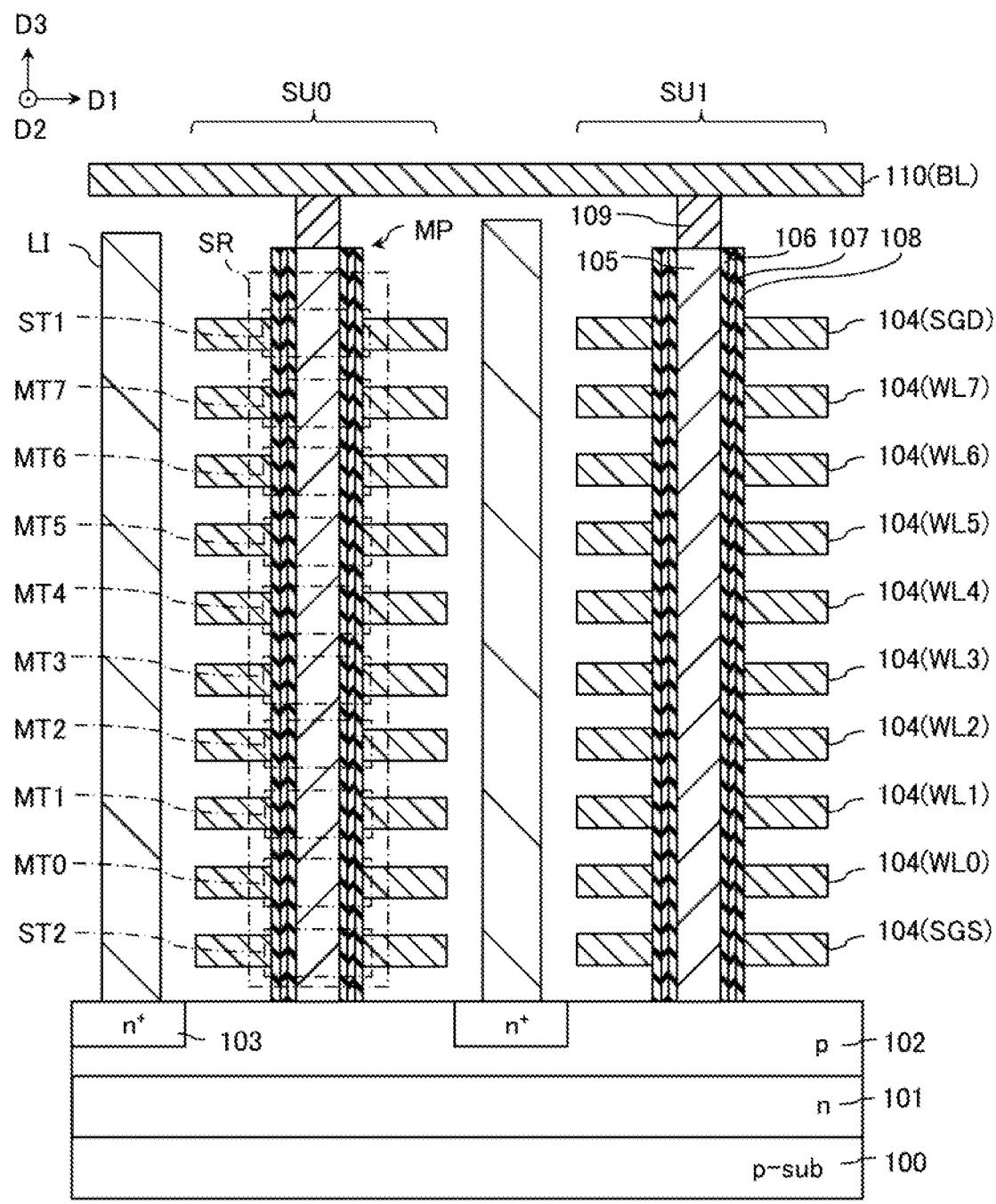
FIG. 3 is a cross-sectional view of the memory cell array provided in the semiconductor memory device according to the first embodiment.

A configuration of the memory cell array 10 will be described below with reference to FIG. 3. In an example of FIG. 3, sections of the string units SU0 and SU1 are illustrated, and this is also applied to a configuration of the string units SU2 and SU3. In FIG. 3, an interlayer insulating film is not specifically illustrated.

As illustrated in FIG. 3, a plurality of source line contacts LI are provided in a first direction D1 parallel to the semiconductor substrate 100 to extend in a second direction D2 parallel to the semiconductor substrate 100 and perpendicular to the first direction D1. One string unit SU is provided between two source line contacts LI. The source line contact LI connects the semiconductor substrate 100 and a source line SL (not specifically illustrated) provided above the NAND string SR. The source line contact LI and the NAND string SR can be arranged in any manner. For example, a plurality of string units SU may be provided between two source line contacts LI. In addition, as an example, FIG. 3 illustrates a case where a plurality of NAND strings SR are arranged in one row along the second direction D2 in one string unit SU for the sake of simplicity of the description, but the NAND strings SR in one string unit SU can be arranged in any manner. For example, the NAND strings SR may be arranged in parallel in two rows along the second direction D2, or may be arranged in four rows in a staggered manner.

In each of the string units SU, the NAND string SR is formed along a third direction D3 perpendicular to the semiconductor substrate 100. More specifically, an n-type well 101 is provided in a surface region of the semiconductor substrate 100. In the surface region of the n-type well 101, a p-type well 102 is provided. Further, an $n^+$-type diffusion layer 103 is provided in a part of the surface region of the p-type well 102. On the p-type well 102, ten interconnection layers 104 are sequentially stacked with interlayer insulating films (not illustrated) interposed respectively therebetween to function as the selection gate line SGS, the word lines WL0 to WL7 connected to the memory cell transistors MT0 to MT7, and the selection gate line SGD.

A pillar-like semiconductor layer 105 is formed to penetrate through the ten interconnection layers 104 and reach the p-type well 102. On a side surface of the semiconductor layer 105, a tunnel insulating film 106, a charge storage layer 107, and a block insulating film 108 are sequentially formed. The semiconductor layer 105 can be formed of polycrystalline silicon, for example. The tunnel insulating film 106 and the block insulating film 108 can be formed of a silicon oxide, for example. The charge storage layer 107 can be formed of a silicon nitride, for example. The semiconductor layer 105 functions as a current path of the NAND string SR, and is a region where the channels of the transistors are formed. Then, an upper end of the semiconductor layer 105 is connected to an interconnection layer 110, extending in the first direction D1, via a contact plug 109. The interconnection layer 110 functions as a bit line BL.

Hereinafter, a pillar formed by the semiconductor layer 105, the tunnel insulating film 106, the charge storage layer 107, and the block insulating film 108 is called "memory pillar MP". The memory pillar MP and the word lines WL0 to WL7 form the memory cell transistors MT0 to MT7. Similarly, the memory pillar MP and the selection gate lines SGD and SGS form the selection transistors ST1 and ST2, respectively.

In the example of FIG. 3, one interconnection layer 104 functioning as the selection gate lines SGD and SGS is provided, but a plurality of layers may be provided.

The source line contact LI has a line shape along the second direction D2. The source line contact LI can be formed of polycrystalline silicon (polysilicon), for example. Then, a bottom surface of the source line contact LI is connected to the n$^+$-type diffusion layer 103, and an upper surface thereof is connected to an interconnection layer functioning as a source line SL.

The memory cell array 10 may have other configurations. For example, the configuration of the memory cell array 10 can be as described in U.S. patent application Ser. No. 12/407,403 "THREE DIMENSIONAL STACKED NON-VOLATILE SEMICONDUCTOR MEMORY," filed on Mar. 19, 2009; the configuration described in U.S. patent application Ser. No. 12/406,524 "THREE DIMENSIONAL STACKED NONVOLATILE SEMICONDUCTOR MEMORY," filed on Mar. 18, 2009; U.S. patent application Ser. No. 12/679,991 "NON-VOLATILE SEMICONDUCTOR STORAGE DEVICE AND METHOD OF MANUFACTURING THE SAME," filed on Mar. 25, 2010; or U.S. patent application Ser. No. 12/532,030 "SEMICONDUCTOR MEMORY AND METHOD FOR MANUFACTURING SAME," filed on Mar. 23, 2009. The entire contents of the above-referenced patent applications are incorporated hereon by reference.

1.1.4 Configuration of Row Decoder

Figure 4:
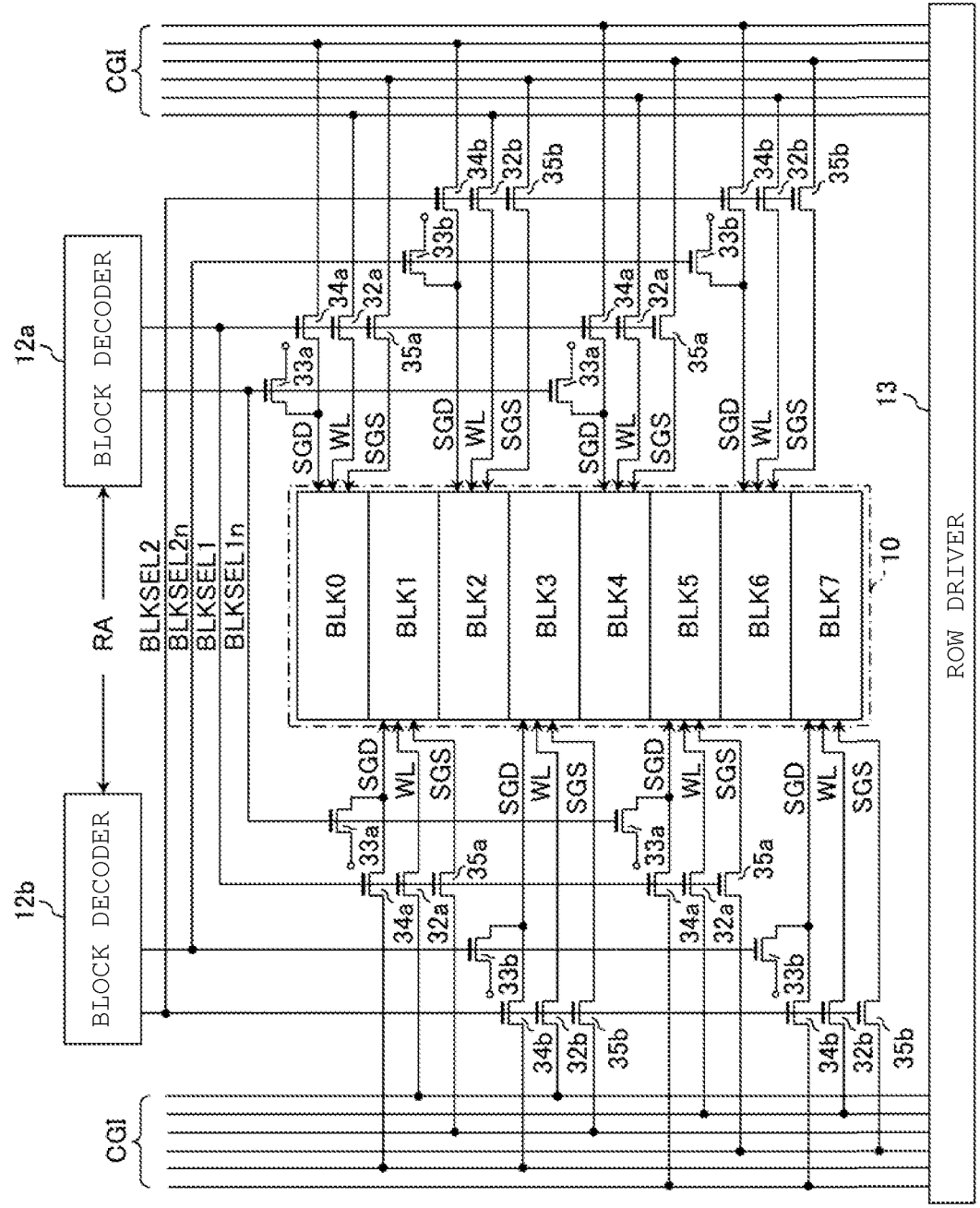
FIG. 4 is a view illustrating a connection of a row decoder provided in the semiconductor memory device according to the first embodiment.

The configuration of the row decoders 11a and 11b will be described below with reference to FIG. 4. As an example, and for the sake of simplicity, FIG. 4 illustrates just one of the word lines WL0 to WL7 (labeled as "WL" in FIG. 4), just one of the selection gate lines SGS0 to SGS3 (labeled as "SGS" in FIG. 4), and just one of the selection gate lines SGD0 to SGD3 (labeled as "SGD" in FIG. 4) connected to each block BLK. In the following description, unless the source and the drain of the transistor are specified, one of the source and the drain of the transistor is referred to as "one end of the transistor", and the other of the source and the drain of the transistor is referred to as "the other end of the transistor".

As illustrated in FIG. 4, the row decoder 11a includes a block decoder 12a and a plurality of n-channel MOS transistors 32a, 33a, 34a, and 35a. Similarly, the row decoder 11b includes a block decoder 12b and a plurality of n-channel MOS transistors 32b, 33b, 34b, and 35b.

The block decoder 12a determines logic levels of a signal line BLKSEL1 and a signal line BLKSEL1n based on the row address RA, and controls ON/OFF states of the transistors 32a, 33a, 34a, and 35a. Similarly, the block decoder 12b determines logic levels of a signal line BLKSEL2 and a signal line BLKSEL2n based on the row address RA, and controls ON/OFF states of the transistors 32b, 33b, 34b, and 35b.

The transistors 32a, 32b, 33a, 33b, 34a, 34b, 35a, and 35b function as block selection transistors for connecting the corresponding block BLK and the row driver 13 via a signal line CGI. In the following description, unless one of the transistors 32a and 32b, 33a and 33b, 34a and 34b, and 35a and 35b are being specifically described, each will be simply referred to as transistors 32, 33, 34, and 35, respectively, unless otherwise specified.

More specifically, the transistors 32a are provided corresponding to the respective word lines WL (WL0 to WL7) of the respective blocks BLK0, BLK1, BLK4, and BLK5. Gates of the transistors 32a corresponding to the respective blocks BLK are connected to the signal line BLKSEL1 in common. One end of the transistor 32a corresponding to the block BLK0 is connected to one of the word lines WL of the block BLK0, and the other end of the transistor 32a is connected to the row driver 13 via the signal line CGI. One end of the transistor 32a corresponding to the block BLK1 is connected to one of the word lines WL of the block BLK1, and the other end of the transistor 32a is connected to the row driver 13 via a signal line CGI different from the transistor 32a corresponding to the block BLK0. One end of the transistor 32a corresponding to the block BLK4 is connected to one of the word lines WL of the block BLK4, and the other end of the transistor 32a is connected to the row driver 13 via a signal line CGI different from the transistors 32a corresponding to the blocks BLK0 and BLK1. One end of the transistor 32a corresponding to the block BLK5 is connected to one of the word lines WL of the block BLK5, and the other end of the transistor 32a is connected to the row driver 13 via a signal line CGI different from the transistors 32a corresponding to the blocks BLK0, BLK1, and BLK4.

The transistors 33a and 34a are provided for the respective selection gate lines SGD0 to SGD3 of the respective blocks BLK0, BLK1, BLK4, and BLK5. Gates of the transistors 33a corresponding to the respective blocks BLK are connected to the signal line BLKSEL1n in common. One end of the transistor 33a for the block BLK0 is connected to one of the selection gate lines SGD of the block BLK0, and the other end of the transistor 33a is grounded. One end of the transistor 33a for the block BLK1 is connected to one of the selection gate lines SGD of the block BLK1, and the other end of the transistor 33a is grounded. One end of the transistor 33a for the block BLK4 is connected to one of the selection gate lines SGD of the block BLK4, and the other end of the transistor 33a is grounded. One end of the transistor 33a for the block BLK5 is connected to one of the selection gate lines SGD of the block BLK5, and the other end of the transistor 33a is grounded.

Gates of the transistors 34a corresponding to the respective blocks BLK are connected to the signal line BLKSEL1 in common. One end of the transistor 34a for the block BLK0 is connected to one of the selection gate lines SGD of the block BLK0, and the other end of the transistor 34a is connected to the row driver 13 via the signal line CGI. One end of the transistor 34a for the block BLK1 is connected to one of the selection gate lines SGD of the block BLK1, and the other end of the transistor 34a is connected to the row driver 13 via a signal line CGI different from the transistor 34a for the block BLK0. One end of the transistor 34a for the block BLK4 is connected to one of the selection gate lines SGD of the block BLK4, and the other end of the transistor 34a is connected to the row driver 13 via a signal line CGI different from the transistors 34a for the blocks BLK0 and BLK1. One end of the transistor 34a for the block BLK5 is connected to one of the selection gate lines SGD of the block BLK5, and the other end of the transistor 34a is connected to the row driver 13 via a signal line CGI different from the transistors 34a for the blocks BLK0, BLK1, and BLK4.

The transistors 35a are provided corresponding to the respective selection gate lines SGS0 to SGS3 of the respective blocks BLK0, BLK1, BLK4, and BLK5. Gates of the transistors 35a for the respective blocks BLK are connected to the signal line BLKSEL1 in common. One end of the transistor 35a for the block BLK0 is connected to one of the selection gate lines SGS of the block BLK0, and the other end of the transistor 35a is connected to the row driver 13 via the signal line CGI. One end of the transistor 35a for the block BLK1 is connected to one of the selection gate lines SGS of the block BLK1, and the other end of the transistor 35a is connected to the row driver 13 via a signal line CGI different from the transistor 35a for the block BLK0. One end of the transistor 35a for the block BLK4 is connected to one of the selection gate lines SGS of the block BLK4, and the other end of the transistor 35a is connected to the row driver 13 via a signal line CGI different from the transistors 35a for the blocks BLK0 and BLK1. One end of the transistor 35a for the block BLK5 is connected to one of the selection gate lines SGS of the block BLK5, and the other end of the transistor 35a is connected to the row driver 13 via a signal line CGI different from the transistors 35a for the blocks BLK0, BLK1, and BLK4.

Similarly to the transistors 32a, the transistors 32b are provided corresponding to the respective word lines WL (WL0 to WL7) of the respective blocks BLK2, BLK3, BLK6, and BLK7. Gates of the transistors 32b for the respective blocks BLK are connected to the signal line BLKSEL2 in common. One end of the transistor 32b is connected to one of the word lines WL of the corresponding block BLK, and the other ends of the transistors 32b are connected to the row driver 13 via different signal lines CGI. In an example of FIG. 4, the other end of the transistor 32a of the block BLK0 and the other end of the transistor 32b of the block BLK2 are connected to the same signal line CGI, but may be connected to different signal lines CGI, respectively. This is also applied to the connection relation between the transistor 32a of the block BLK1 and the transistor 32b of the block BLK3, between the transistor 32a of the block BLK2 and the transistor 32b of the block BLK6, and between the transistor 32a of the block BLK3 and the transistor 32b of the block BLK7.

Similarly to the transistors 33a and 34b, the transistors 33b and 34b are provided corresponding to the respective selection gate lines SGD of the respective blocks BLK2, BLK3, BLK6, and BLK7. Gates of the transistors 33b corresponding to the respective blocks BLK are connected to the signal line BLKSEL2n in common, and gates of the transistors 34b corresponding to the respective blocks BLK are connected to the signal line BLKSEL2 in common. One end of the transistor 33b is connected to one of the selection gate lines SGD of the corresponding block BLK, and the other end of the transistor 33b is grounded. One end of the transistor 34b is connected to one of the selection gate lines SGD of the corresponding block BLK, and the other ends of the transistors 34b are connected to the row driver 13 via different signal lines CGI. In the example of FIG. 4, the other end of the transistor 34a of the block BLK0 and the other end of the transistor 34b of the block BLK2 are connected to the same signal line CGI, but may be connected to different signal lines CGI, respectively. This is also applied to the connection relation between the transistor 34a of the block BLK1 and the transistor 34b of the block BLK3, between the transistor 34a of the block BLK2 and the transistor 34b of the block BLK6, and between the transistor 34a of the block BLK3 and the transistor 34b of the block BLK7.

Similarly to the transistors 35a, the transistors 35b are provided corresponding to the respective selection gate lines SGS of the respective blocks BLK2, BLK3, BLK6, and BLK7. Gates of the transistors 35b corresponding to the respective blocks BLK are connected to the signal line BLKSEL2 in common. One end of the transistor 35b is connected to one of the selection gate lines SGS of the corresponding block BLK, and the other ends of the transistors 35b are connected to the row driver 13 via different signal lines CGI. In the example of FIG. 4, the other end of the transistor 35a of the block BLK0 and the other end of transistor 35b of the block BLK2 are connected to the same signal line CGI, but may be connected to different signal lines CGI, respectively. This is also applied to the connection relation between the transistor 35a of the block BLK1 and the transistor 35b of the block BLK3, between the transistor 35a of the block BLK2 and the transistor 35b of the block BLK6, and between the transistor 35a of the block BLK3 and the transistor 35b of the block BLK7.

For example, when the row address RA coincides with the corresponding block BLK0 of the block decoder 12a during the writing, reading, and erasing of the data, the block decoder 12a applies a High ("H")-level voltage to the signal line BLKSEL1 and applies a Low ("L")-level voltage (for example, a ground voltage VSS) to the signal line BLKSEL1n. Thus, the transistors 32a, 34a, and 35a corresponding to the blocks BLK0, BLK1, BLK4, and BLK5 enter an ON state, and the transistor 33a enters an OFF state. In addition, the block decoder 12b applies an L-level voltage to the signal line BLKSEL2 and applies an H-level voltage to the signal line BLKSEL2n. Thus, the transistors 32b, 34b, and 35b corresponding to the blocks BLK2, BLK3, BLK6, and BLK7 enter an OFF state, and the transistor 33b enters an ON state. In these states, the row driver 13 applies a necessary voltage to the word line WL and the selection gate lines SGD and SGD of the block BLK0, based on the row address RA.

1.2 Write Operation

A write operation includes a program operation and a program verification operation. When the combination of the program operation and the program verification operation (hereinafter, referred to as a "program loop") is repeated, a threshold voltage of the memory cell transistor MT is increased up to a target level. In addition, the write operation includes an ON/OFF operation and a dummy read operation of the block select transistor. The ON/OFF operation and the dummy read operation are executed after the program loop is terminated.

The program operation is an operation of injecting electrons into a charge storage layer to increase the threshold voltage (or inhibiting injection to maintain the existing threshold voltage). In the following description, an operation of increasing the threshold voltage is referred to as a program operation of "0" data value, and a voltage (for example, a voltage VSS) corresponding to data of "0" is applied to a particular bit line BL connected to a memory cell, which is a target of the program operation, from the sense amplifier 20. On the other hand, for a program operation of "1" or a write inhibition, and a voltage (hereinafter, referred to as a "voltage VBL1") corresponding to the data value of "1" is applied to a particular bit line BL, which a target of the program operation for data value "1", from the sense amplifier 20. Hereinafter, the targeted bit line for the program operation of "0" is referred to as BL ("0"), and the targeted bit line for the program operation of "1" is referred to as BL ("1").

The program verification operation is a reading of data after a program operation and determining whether the threshold voltage of the targeted memory cell transistor MT has reached the intended target level.

The ON/OFF operation of the selected block transistors is performed to reduce current leakage of the selection transistors by turning off the block selection transistors 32, 34, and 35 of the addressed block BLK (hereinafter, referred to as a "selected block BLK") after the program loop is terminated. In the ON/OFF operation of the selected block transistors, a gate voltage of the selected block transistors falls to the voltage VSS.

The dummy read operation is an operation of applying a voltage that is normally applied during the (non-dummy) read operation to the word lines WL and the selection gate lines SGD and SGS. However, in the dummy read operation, unlike the general (non-dummy) read operation, no positive voltage is applied to the bit line BL and the source line SL and thus an actual reading of data is not performed. In the dummy read operation, data of any memory cell transistor MT may be read out.

1.2.1 Overall Flow of Write Operation

An overall flow of the write operation will be described below with reference to FIG. 5.

Figure 5:
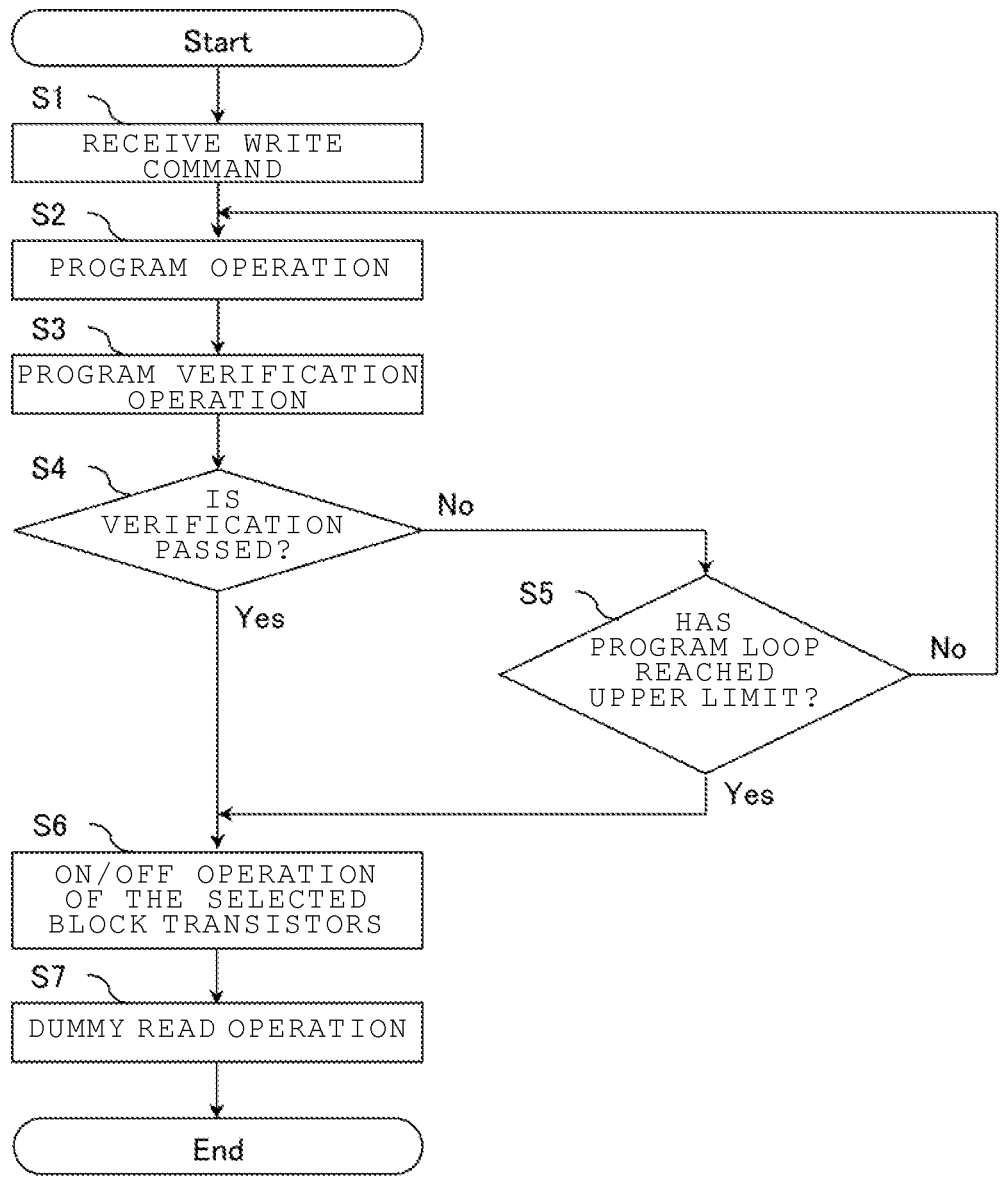
FIG. 5 is a flowchart of a write operation in the semiconductor memory device according to the first embodiment.

As illustrated in FIG. 5, the sequencer 16 receives a write command (inclusive of command language, an address, and write data) from an external controller (step S1).

The sequencer 16 starts a write operation based on the write command and executes a program operation (step S2).

The sequencer 16 executes a program verification operation once the program operation is terminated (step S3).

When the program verification operation is not passed (No in step S4), that is, when the threshold voltage of the memory cell transistor MT does not reach the target level, the sequencer 16 determines whether the total number of program loops has yet reached a preset upper limit.

When the number of program loops has not reached the upper limit (No in step S5), the process returns to step S2, and the sequencer 16 executes the program operation again. On the other hand, once the number of program loops has reached the upper limit count (Yes in step S5), the sequencer 16 terminates the program loop.

When the program verification operation passes (Yes in step S4), the sequencer 16 terminates the program loop.

Upon terminating the program loop, the sequencer 16 executes the ON/OFF operation of the selected block transistors (step S6). More specifically, after the program loop is terminated, the sequencer 16 turns off the transistors 32, 34, and 35 corresponding to the selected block BLK while the voltage VSS is applied to the word lines WL and the selection gate lines SGD and SGS. Thereafter, the sequencer 16 turns off the transistors 32, 34, and 35 again after once turning on the transistors 32, 34, and 35.

The sequencer 16 then executes a dummy read after executing the ON/OFF operation of the selected block transistors (step S7). The write operation is completed.

1.2.2 Voltages of Interconnections in Write Operation

Voltages of interconnections in the write operation will be described below with reference to FIG. 6. As an example, FIG. 6 illustrates a first program loop (program operation and program verification operation), a program verification operation in a last program loop, an ON/OFF operation of the selected block transistors, and a dummy read operation in the block BLK0 to be written.

Figure 6:
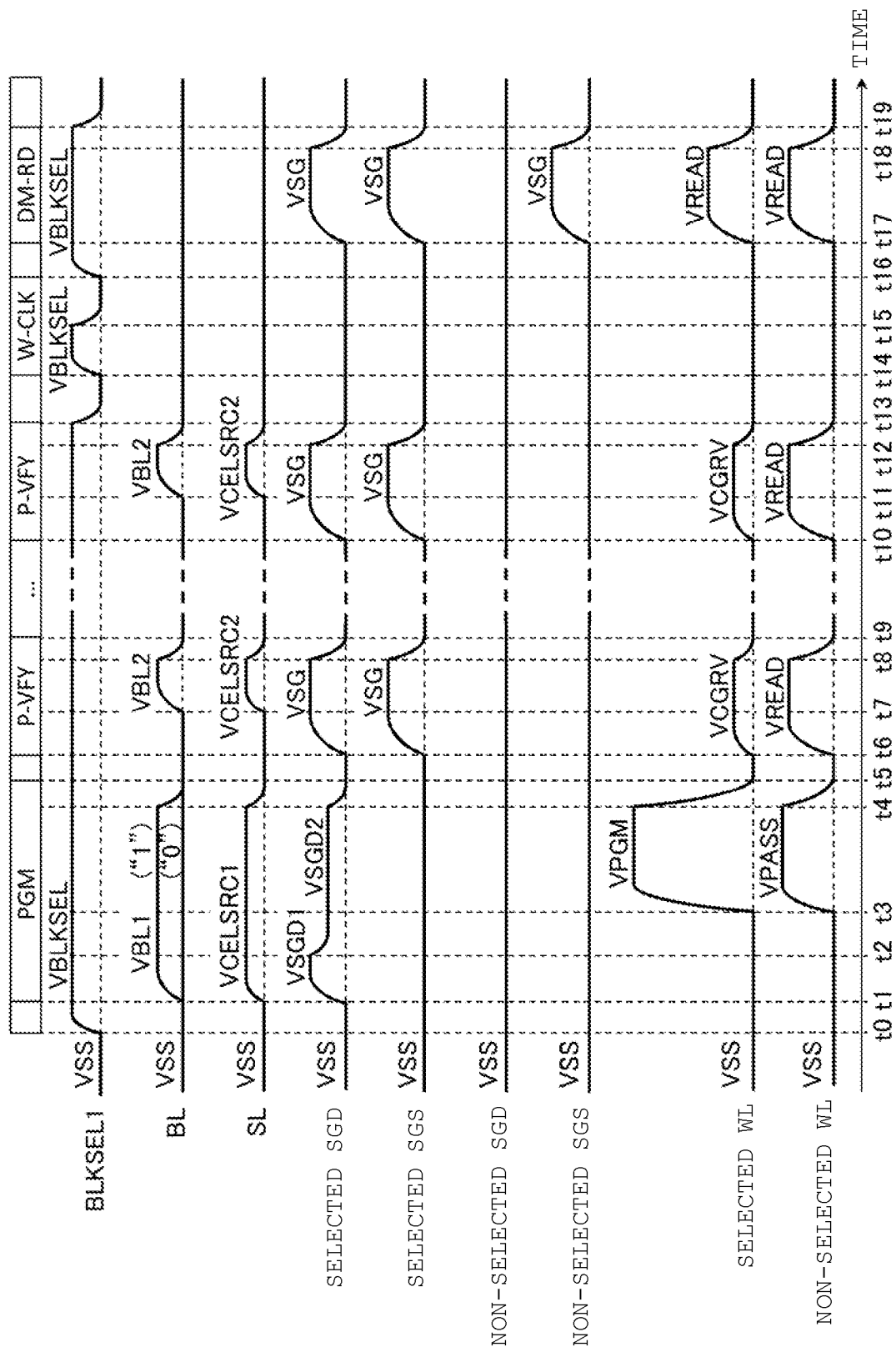
FIG. 6 is a timing chart illustrating voltages of interconnections at the time of the write operation in the semiconductor memory device according to the first embodiment.

As illustrated in FIG. 6, a period from time t1 to time t5 indicates the first program operation (reference symbol "PGM"), and a period from time t6 to time t9 indicates the first program verification operation (reference symbol "P-VFY"). In addition, a period from time t10 to time t13 indicates the last program verification operation (reference symbol "P-VFY"), a period from time t14 to time t16 indicates the ON/OFF operation (reference symbol "W-CLK") of the block select transistor, and a period from time t17 to time t19 indicates the dummy read operation (reference symbol "DM-RD"). The voltages of the interconnections in the program verification operation are the same as the voltages of the interconnections in the read operation.

First, at time t0, the block decoder 12a corresponding to the block BLK0 applies a voltage VBLKSEL to the signal line BLKSEL1 to make the voltage in an H-level state, and applies a voltage VSS to the signal line BLKSEL1*n* (not illustrated) to make the voltage in an L-level state. The voltage VBLKSEL causes the transistors 32, 34, and 35 to be in ON state. Thus, the transistors 32a, 34a, and 35a enter an ON state, and the transistor 33a enters an OFF state.

The first program operation will be described in detail below.

At time t1, the sense amplifier 14 applies a voltage VSS to the bit line BL ("0") corresponding to the program operation of "0", and applies a voltage VBL1 to the bit line BL ("1") corresponding to the program operation of "1".

The row driver 13 applies a voltage VSGD1 to the selection gate line SGD (reference symbol "selected SGD") of the selected string unit SU of the selected block BLK. Assuming that the threshold voltage of the selection transistor ST1 is Vtsg, a voltage VSD1 causes the selection transistor ST1 to enter the ON state with a voltage equal to or higher than "VBL1+Vtsg". On the other hand, the row driver 13 applies a voltage VSS to the selection gate line SGD (reference symbol "non-selected SGD") of the non-selected string unit SU of the selected block BLK, and causes the corresponding selection transistor ST1 to enter the OFF state. In addition, the row driver 13 applies a voltage VSS to the selection gate line SGS (reference symbol "selected SGS") of the selected string unit SU and the selection gate line SGS (reference symbol "non-selection SGS") of the non-selected string unit SU, and causes the selection transistor ST2 to enter the OFF state.

Further, a voltage VCELSRC1 (>VSS) is applied to the source line SL via a source line driver (not illustrated), for example.

At time t2, the row driver 13 applies a voltage VSGD2 to the selection gate line SGD of the selected string unit SU. The voltage VSD2 is a voltage lower than the voltage VSGD1 and the voltage VBL1, and causes the selection transistor ST1 to which the voltage VSS is applied to enter the ON state but causes the selection transistor ST1 to which the voltage VBL1 is applied to enter a cutoff state. Thus, a channel of the NAND strings SR corresponding to the bit line BL ("1") is in a floating state.

At time t3, the row driver 13 applies a voltage VPASS to the non-selected word line WL (reference symbol "non-selected WL") of the selected block BLK. The voltage VPASS causes the memory cell transistor MT to enter the ON state regardless of the threshold voltage of the memory cell transistor MT. In addition, the row driver 13 applies a voltage VPGM to the selected word line WL (reference symbol "selected WL") of the selected block BLK. The voltage VPGM is a high voltage for injecting electrons into the charge storage layer 107. The voltage VPGM and the voltage VPASS are in a relation of VPGM>VPASS. The row driver 13 may apply the voltage VPGM to the selected word line WL after applying the voltage VPASS to the selected word line WL.

Since the selection transistor ST1 is in the ON state in the NAND string SR corresponding to the bit line BL ("0"), a channel potential of the memory cell transistor MT connected to the selected word line WL becomes VSS. Accordingly, a potential difference (VPGM−VSS) between the control gate and the channel increases. As a result, electrons are injected into the charge storage layer 107, and the threshold voltage of the memory cell transistor MT corresponding to the bit line BL ("0") is raised.

Since the selection transistor ST1 is in a cutoff state in the NAND string SR corresponding to the bit line BL ("1"), the channel of the memory cell transistor MT connected to the selected word line WL is electrically floated. Then, a channel potential rises due to capacitive coupling with the word line WL. Therefore, a potential difference between the control gate and the channel becomes smaller than the memory cell transistor MT corresponding to the bit line BL ("0"). As a result, electrons are hardly injected into the charge storage layer 107, and the threshold voltage of the memory cell transistor MT corresponding to the bit line BL ("1") is kept (that is, as the threshold distribution level transitions to a higher distribution, the threshold voltage does not fluctuate).

During the period from time t4 to time t5, recovery processing is executed and the program operation is terminated.

Next, the first program verification operation will be described in detail. At time t6, the row driver 13 applies a voltage VSG to the selection gate lines SGD and SGS of the selected string unit SU, applies a read voltage VCGRV to the selected word line WL, and applies a voltage VREAD to the non-selected word line WL. The voltage VSG causes the selection transistors ST1 and ST2 to enter the ON state. The voltage VCGRV is a voltage corresponding to a threshold level of the data to be read. The voltage VREAD is applied to the non-selected word line WL in the read operation, and the memory cell transistor MT in which the voltage VREAD is applied to the control gate is in the ON state regardless of the data to be retained. The voltage VCGRV and the voltage VREAD are in a relation of VCGRV<VREAD.

At time t7, the sense amplifier 14 applies a voltage VBL2 to the bit line BL. The voltage VBL2 is applied to the bit line BL in the read operation. In addition, a voltage VCELSRC2 is applied to the source line SL via the source line driver. The voltage VBL2 and the voltage VCELSRC2 are in a relation of VBL2>VCELSRC2 (>VSS).

During the period from time t7 to time t8, the sense amplifier 14 senses a current flowing through the bit line BL, for example. More specifically, when the threshold voltage of the memory cell transistor MT to be read is equal to or higher than a voltage VCGRV, the memory cell transistor MT enters an OFF state (hereinafter, referred to as an "off-cell"), and a current hardly flows from the corresponding bit line BL to the source line SL. On the other hand, when the threshold voltage of the memory cell transistor MT to be read is lower than the voltage VCGRV, the memory cell transistor MT enters an ON state (hereinafter, referred to as an "on-cell"), and a current flows from the corresponding bit line BL to the source line SL. When the number of on-cells is less than the preset number, the sequencer 16 determines that the program verification operation has passed, and when the number of on-cells is equal to or more than the preset number, the sequencer 16 determines that the program verification operation has failed.

During the period from time t8 to time t9, recovery processing is performed, and the program verification operation is terminated. When the memory cell transistor MT can retain data of 2 bits or more and executes a program verification operation of a plurality of threshold levels, the operation from time t6 to time t9 is repeated for each threshold level. In this case, the voltages VCGRV are respectively set corresponding to the threshold level.

During the period from time t9 to time t10, the program operation is executed in a plurality of program loops and the last program loop.

The program verification operation in the last program loop will be described below. The operation from time t10 to time t13 is the same as the operation from time t6 to time t9. In the last program verification operation, for example, the number of on-cells is less than the preset number and the program verification operation is passed.

When the program loop is terminated in the period from time t13 to time t14, the block decoder 12a applies a voltage VSS to the signal line BLKSEL1 to make the voltage in an L-level state and applies a voltage VBLKSEL to the signal line BLKSEL1n to make the voltage in an H-level state. Thus, the transistors 32a, 34a, and 35a enter an OFF state, and the transistor 33a enters an ON state.

The ON/OFF operation of the selected block transistors will be described in detail below.

During the period from time t14 to time t15, the block decoder 12a applies a voltage VBLKSEL to the signal line BLKSEL1, and applies a voltage VSS to the signal line BLKSEL1n. Thus, the transistors 32a, 34a, and 35a enter an ON state, and the transistor 33a enters an OFF state.

During the period from time t15 to time t16, the block decoder 12a applies a voltage VSS to the signal line BLKSEL1 to make the voltage in an L-level state, and applies a voltage VBLKSEL to the signal line BLKSEL1n to make the voltage in an H-level state. Thus, the transistors 32a, 34a, and 35a enter an OFF state, and the transistor 33a enters an ON state.

At time t16, due to the dummy read operation, the block decoder 12a applies a voltage VBLKSEL to the signal line BLKSEL1, and applies a voltage VSS to the signal line BLKSEL1n.

The dummy read operation will be described in detail below.

At time t17, the row driver 13 applies a voltage VSS to the selection gate lines SGD and SGS of the selected string unit SU of the selected block BLK and the selection gate line SGS of the non-selected string unit SU. In addition, the row driver 13 applies a voltage VREAD to the selected word line WL and the non-selected word line of the selected block BLK. A voltage VSG may be applied to the selection gate line SGD of the non-selected string unit SU instead of being applied to the selection gate line SGS of the non-selected string unit SU.

During the period from time t18 to time t19, recovery processing is also performed, and the dummy read operation is terminated.

At time t19, the block decoder 12a applies a voltage VSS to the signal line BLKSEL1 to make the voltage in an L-level state, and applies a voltage VBLKSEL to the signal line BLKSEL1n to make the voltage in an H-level state. Thus, the transistors 32a, 34a, and 35a enter an OFF state, and the transistor 33a enters an ON state.

1.3 Effects of First Embodiment

According to the first embodiment, reliability can be improved. The effect will be described below.

Figure 7:
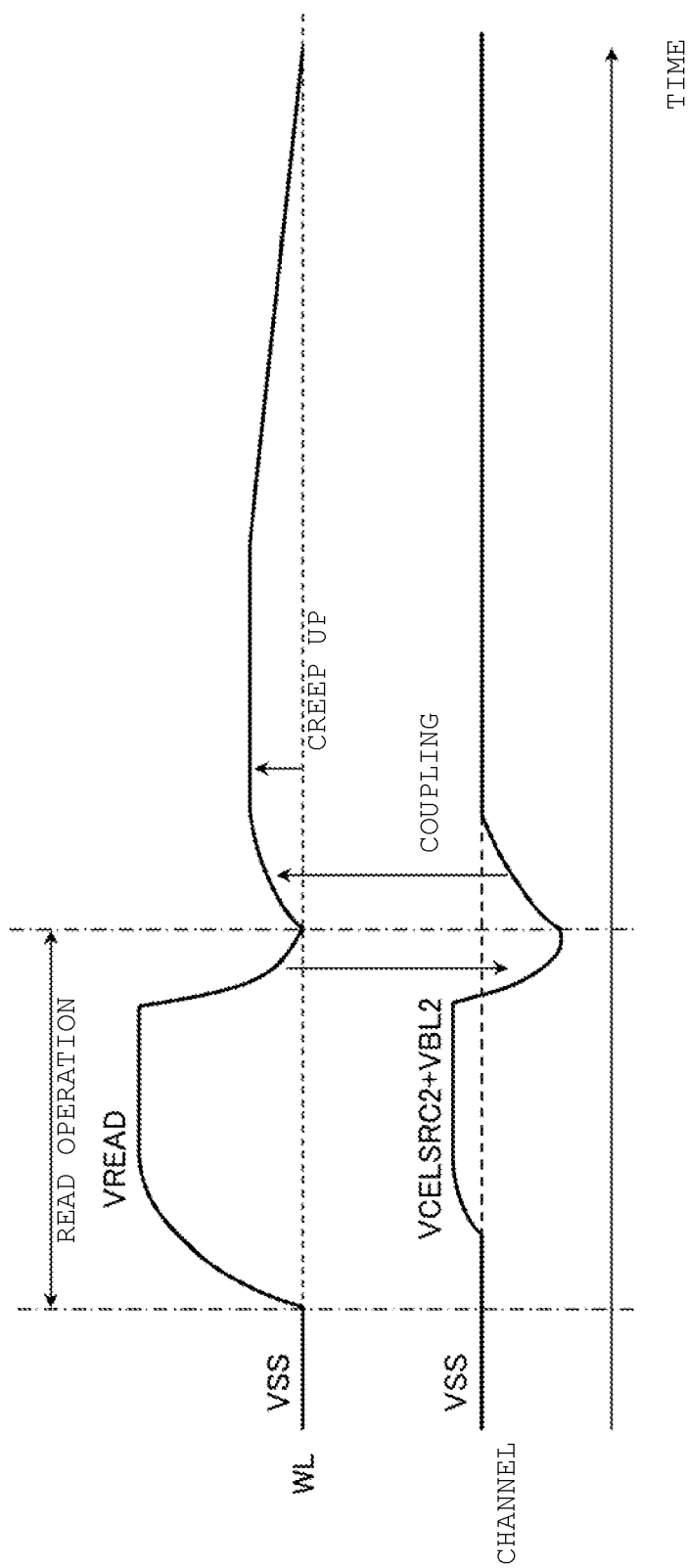
FIG. 7 is a timing chart illustrating voltages of a word line and a channel of an NAND string in a read operation.

In the NAND flash memory 1 in which the memory cells are three-dimensionally stacked, the channel of the memory cell transistor MT constituting the NAND string SR has a structure in which the semiconductor layer 105 is shared as illustrated in FIG. 3, for example. In the NAND flash memory 1 having such a structure a phenomenon, as illustrated in FIG. 7, may occur. FIG. 7 illustrates an example of voltages of the word line WL and the channel of the NAND string SR in the read operation.

As illustrated in FIG. 7, when the read operation is executed, the row driver 13 applies a voltage VREAD to the non-selected word lines WL of the selected block BLK. At this time, the voltage of the channel rises to VCELSRC2+VBL2. However, the voltage (VCELSRC2+VBL2) is smaller than the voltage VREAD and there can be a voltage difference of several volts. Once the read data is determined, the row driver 13 lowers the voltage of the non-selected word lines WL to the ground voltage VSS. At this time, the voltage of the channel of the NAND string SR can fall from the ground voltage VSS to a negative voltage due to coupling with the word line WL. After the read operation, the block BLK is no longer selected, so the word lines WL are in a floating state. In this state, when the voltage of the negative voltage channel returns to the ground voltage VSS with the elapse of time, the voltage of the (floating) word lines WL rises to greater than the ground voltage VSS due to the coupling with the channel of the NAND string SR. This phenomenon is called creep-up.

In the block BLK in which the voltage of the word line WL rises due to creep-up, a potential difference is generated between the control gate and the channel of the memory cell transistor MT in the block BLK, and the threshold voltage may shift with the elapse of time after the read operation.

Then, the voltage of the word line WL raised by the creep-up subsequently returns to the ground voltage VSS with the elapse of time as illustrated in FIG. 7. When the fluctuation of the voltage on the word lines WL due to the creep-up is finally settled, the threshold voltage of the memory cell transistor MT returns to its original state. In this manner, the memory cell transistor MT can take two states including a first state in which the threshold voltage is in an initial state and a second state in which the threshold voltage shifts under the influence of the creep-up phenomenon. However, since the read voltage is set to be optimized in the second state, for example, the memory cell transistor MT is preferably maintained in the second state in the NAND flash memory 1.

The program loop ends directly after a program verification operation is completed, but the ON/OFF operation of the selected block transistors is performed after the program loop is terminated. Due to the influence of the ON/OFF operation, the time until the memory cell transistor MT transitions from the second state to the first state is reduced as compared with the case in which just the read operation is performed. For this reason, a fail bit count (FBC) tends to increase or a retry read rate (RRP) for re-reading tends to increase due to the influence of the state transition of the memory cell transistor MT in the read operation after the write operation.

In the configuration according to the first embodiment, therefore, the dummy read operation is executed after the program loop and the ON/OFF operation of the selected block transistors. Thus, it is possible to prevent the time until the memory cell transistor MT transitions from the second state to the first state after the write operation from being shortened. Therefore, an increase in the FBC and RRR can be prevented in the read operation after the write operation. Therefore, the reliability of the semiconductor memory device can be improved.

According to the configuration of the first embodiment, the dummy read operation can be performed, and thus it is possible to prevent threshold fluctuation, that is, short term data retention (STDR) occurring in the relatively short period after the write operation.

According to the configuration of the first embodiment, the register 17 includes a register address related to the setting of the dummy read operation, and thus it is possible to enable/disable the dummy read operation. Therefore, it is possible to enable/disable the dummy read operation during the use of the semiconductor memory device 1.

2. Second Embodiment

In the second embodiment, a flow of the write operation is different from that in the first embodiment.

2.1 Overall Flow of Write Operation

Figure 8:
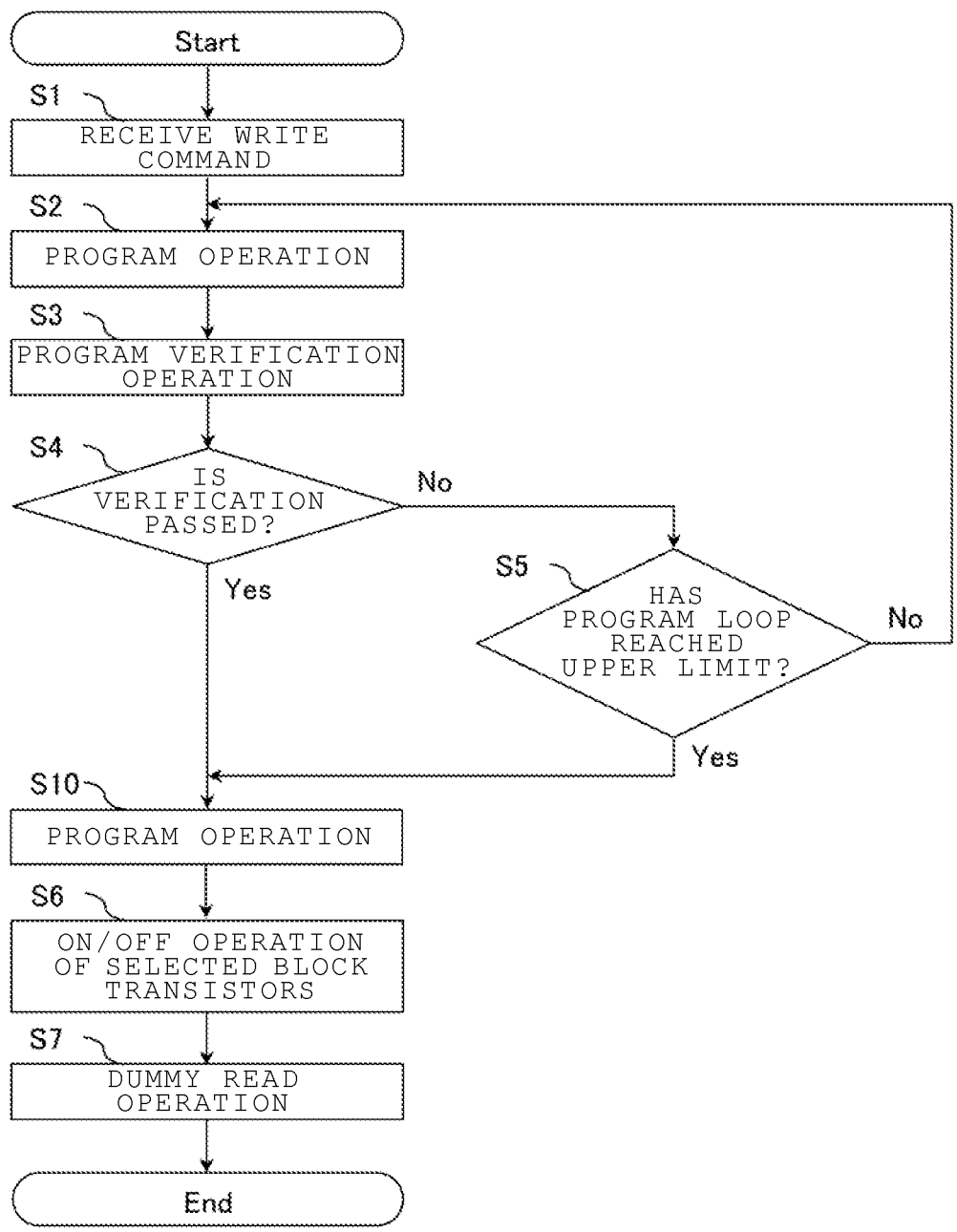
FIG. 8 is a timing chart illustrating voltages of interconnections at the time of a write operation in a semiconductor memory device according to a second embodiment.

As illustrated in FIG. 8, operations of steps S1 to S5 are the same as those in the first embodiment described with reference to FIG. 5.

However, the sequencer 16 executes a program operation again after the program loop is terminated (step S10). That is, the sequencer 16 does not perform the program verification operation directly after the last program operation of the program loop is finished. In some examples, each memory cell transistor MT can retain data of 2 bits or more and includes four distributions levels of increasing voltage: "Er" level, "A" level, "B" level, and "C" level. In this case, the sequencer 16 may perform a program operation of the "B" level by repetition of the program loop and then perform a program operation of the "C" level without the program verification operation after the program verification operation has passed. The program operation may be repeated several times without the program verification operation being performed after each program operation.

The sequencer 16 executes the ON/OFF operation of the selected block transistors as in the first embodiment described with reference to FIG. 5 after the program operation in step S10 is terminated (step S6).

The sequencer 16 executes a dummy read after executing the ON/OFF operation of the selected block transistors (step S7). Thus, the write operation is completed.

2.2 Voltages of Interconnections in Write Operation

Voltages of interconnections in the write operation will be described below with reference to FIG. 9. As an example, FIG. 9 illustrates a program verification operation in a last program loop, a last program operation after the program loop, an ON/OFF operation of the selected block transistors, and a dummy read operation in the block BLK0 to be written.

Figure 9:
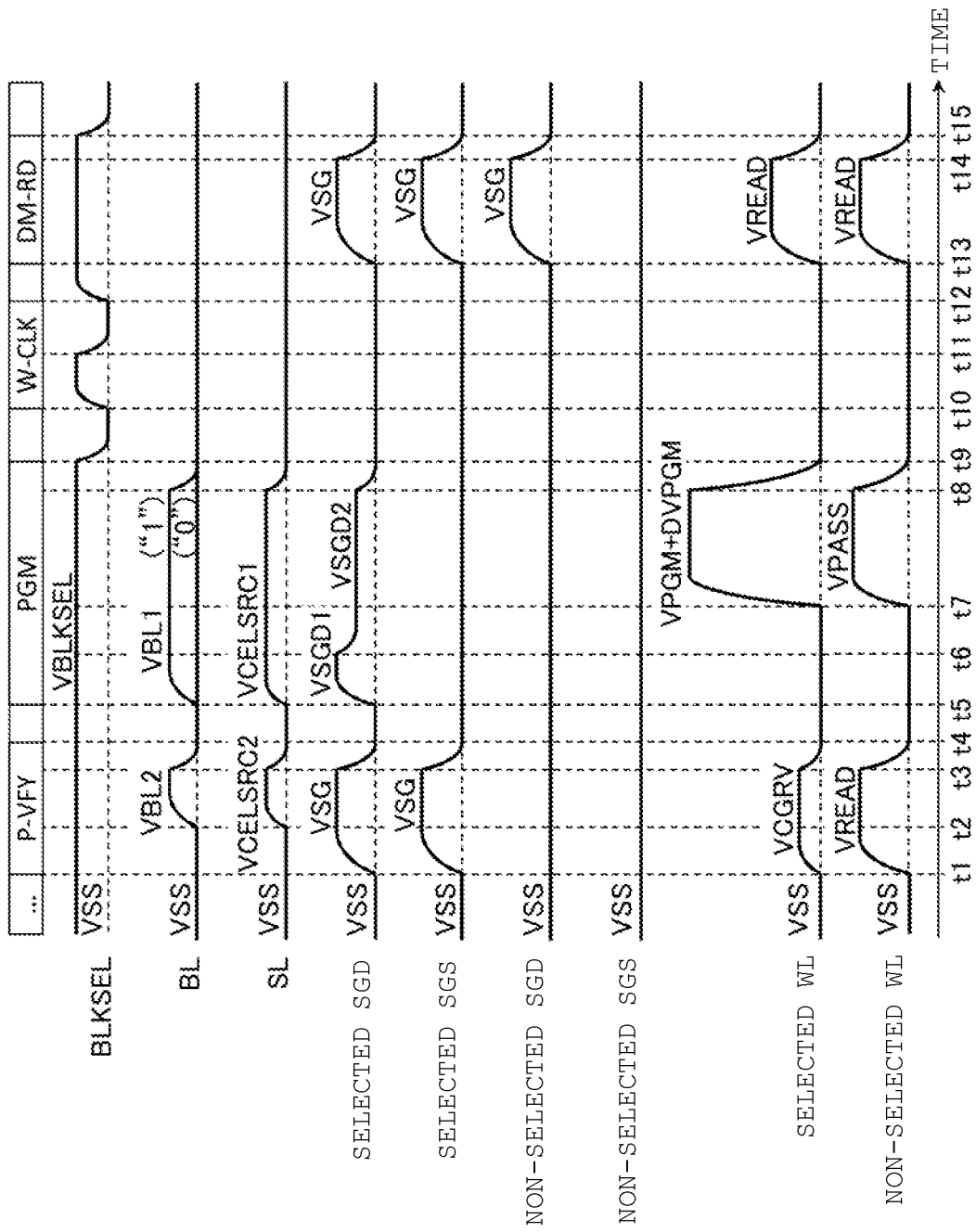
FIG. 9 is a timing chart illustrating voltages of interconnections at the time of the write operation in the semiconductor memory device according to the second embodiment.

As illustrated in FIG. 9, a period from time t1 to time t4 corresponds to the program verification operation in the last program loop, and a period from time t5 to time t10 corresponds to the last program operation after the program loop. Further, a period from time t11 to time t13 corresponds to the ON/OFF operation of the selected block transistors, and a period from time t14 to time t16 corresponds to the dummy read operation.

The program verification operation during the period from time t1 to time t4 is the same as the operation during the period from time t6 to time t9 in the first embodiment described with reference to FIG. 5.

The program operation during the period from time t5 to time t9 is the same as the operation during the period from time t1 to time t5 in the first embodiment described with reference to FIG. 5. The voltage VPGM is stepped up (increased) every time the program loop is repeated. For example, the row driver 13 applies a voltage (VPGM+DVPGM) to the selected word line WL. The voltage DVPGM indicates a step-up voltage increment for the voltage VPGM.

The ON/OFF operation of the selected block transistors during the period from time t10 to time t12 is the same as the operation during the period from time t14 to time t16 in the first embodiment described with reference to FIG. 5.

The dummy read operation will be described below. The dummy read operation may be the same as the operation during the period from time t17 to time t19 in the first embodiment described with reference to FIG. 5.

At time t13, the row driver 13 applies a voltage VSG to the selection gate lines SGD and SGS of the selected string unit SU of the selected block BLK and the selection gate line SGD of the non-selected string unit SU. In addition, the row driver 13 applies a voltage VREAD to the selected word line WL and the non-selected word line of the selected block BLK.

During the period from time t14 to time t15, recovery processing is performed, and the dummy read operation is completed.

At time t15, the block decoder 12a applies a voltage VSS to the signal line BLKSEL1 to make the voltage in a L-level (logic low) state, and applies a voltage VBLKSEL to the signal line BLKSEL1n to make the voltage in an H-level (logic high) state. Thus, the transistors 32a and 34a enter an OFF state, and the transistor 33a enters an ON state.

2.3 Effects of Second Embodiment

According to the configuration of the second embodiment, the same effects as those of the first embodiment can be obtained.

3. Modifications

The semiconductor memory device according to the above embodiments includes: a first memory string (SR) including a first selection transistor (ST1), a first memory cell (MT0), a second memory cell (MT1), and a second selection transistor (ST2) that are connected in series with each other; a first word line (WL0) that is connected to a gate of the first memory cell; a second word line (WL1) that is connected to a gate of the second memory cell; a first selection gate line (SGD) that is connected to a gate of the first selection transistor; a second selection gate line (SGS) that is connected to a gate of the second selection transistor; and a control circuit (16) that controls a write operation. The control circuit performs repetitions of a program loop (that includes a program operation and a program verification operation) in the write operation of the first memory cell, and after all the repetitions of the program loop are completed, executes a first operation (a dummy read) in which a first voltage (VREAD) for turning on the first and second memory cells is applied to the first and second word lines and a second voltage (VSG) for turning on the first and second selection transistors is applied to the first and second selection gate lines.

From the embodiments described above, it is possible to provide a semiconductor memory device having improved reliability.

In addition to the embodiments described above, various modifications can be made.

For example, the case has been described in which data is not read out in the dummy read operation of the above embodiments, but it is also possible for data of any memory cell transistor MT may be read out in the data read operation, for example.

In the dummy read operation of the above embodiments, the voltage applied to the word line WL may be a voltage different from the voltage VREAD.

The term "connection" in the present disclosure also includes a state in which components, such as transistors or resistors, are indirectly connected to each other via a conductive member interposed therebetween.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first memory string including a first selection transistor, a first memory cell, a second memory cell, and a second selection transistor connected in series;
a first word line connected to a gate of the first memory cell;
a second word line connected to a gate of the second memory cell;
a first selection gate line connected to a gate of the first selection transistor;
a second selection gate line connected to a gate of the second selection transistor;
a control circuit configured to control a write operation on the first memory string;
a second memory string including a third selection transistor, a third memory cell, a fourth memory cell, and a fourth selection transistor that are connected in series with each other;
a third selection gate line that is connected to a gate of the third selection transistor; and
a fourth selection gate line that is connected to a gate of the fourth selection transistor, wherein
the write operation includes:
a program loop including a program operation and a program verification operation on the first memory cell, and
after the program loop is completed, applying a first voltage to the first and second word lines and a second voltage to the first and second selection gate lines, the first voltage being sufficient to turn on the first and second memory cells, the second voltage being sufficient to turn on the first and second selection transistors, the first word line is connected to a gate of the third memory cell, the second word line is connected to a gate of the fourth memory cell, the third and fourth selection transistors are in an OFF state during the program loop of the write operation to the first memory cell, and the second voltage is applied to at least one of the third selection gate line and the fourth selection gate line after the program loop is completed.

2. The semiconductor memory device according to claim 1, further comprising:
a driver circuit that is connected to:
the first word line via a first transistor,
the first selection gate line via a second transistor, and
the second selection gate line via a third transistor;
a signal line connected to gates of the first, second, and third transistors; and
a decoder circuit connected to the signal line, wherein the control circuit is further configured to:
apply, after the program loop is completed, but before the first voltage is applied to the first and second word lines, a third voltage to the signal line and then apply a fourth voltage to the signal line after applying the third voltage, the fourth voltage being lower than the third voltage.

3. The semiconductor memory device according to claim 2, wherein in the program verification operation, a read voltage is applied to the first word line, the first voltage is applied to the second word line, and the second voltage is applied to the first and second selection gate lines.

4. The semiconductor memory device according to claim 1, wherein in the program verification operation, a read voltage is applied to the first word line, the first voltage is applied to the second word line, and the second voltage is applied to the first and second selection gate lines.

5. The semiconductor memory device according to claim 1, further comprising:
a driver circuit that is connected to:
the first word line via a first transistor,
the first selection gate line via a second transistor, and
the second selection gate line via a third transistor; and
a signal line connected to gates of the first, second, and third transistors;
wherein the control circuit is further configured to:
perform a single program operation directly after the program loop is completed, then apply a third voltage to the signal line and then a fourth voltage to the signal line after applying the third voltage, the fourth voltage being lower than the third voltage.

6. The semiconductor memory device according to claim 1, wherein the first memory string is a NAND string.

7. A semiconductor memory device, comprising:
a first memory string including a first selection transistor, a first memory cell, a second memory cell, and selection transistor connected in series;
a first word line connected to a gate of the first memory cell;
a second word line connected to a gate of the second memory cell;
a first selection gate line connected to a gate of the first selection transistor;
a second selection gate line connected to a gate of the second selection transistor; and
a control circuit configured to perform a write operation on the first memory string, the write operation including:
a program loop including a program operation and a program verification operation, the program loop being performed at least once on the first memory cell, the program loop being terminated when either the program verification operation verifies the first memory cell has an intended voltage value or a maximum number of program loop iterations has been reached; and
a dummy read operation performed after the program loop has terminated, the dummy read operation comprising: applying a first voltage to first and second word lines and a second voltage to the first and second selection gate lines, the first voltage being sufficient to turn on the first and second memory cells, the second voltage being sufficient to turn on the first and second selection transistors, wherein
the control circuit is further configured to:
perform an ON/OFF operation after the termination of the program loop, but before the dummy read operation, the ON/OFF operation comprising:
applying a third voltage to a signal line connected to a decoder circuit and then a fourth voltage to the signal line after applying the third voltage, the fourth voltage being lower than the third voltage.

8. The semiconductor memory device according to claim 7, further comprising:
a driver circuit that is connected to:
the first word line via a first transistor,
the first selection gate line via a second transistor, and
the second selection gate line via a third transistor;
a signal line connected to gates of the first, second, and third transistors; and
a decoder circuit connected to the signal line.

9. The semiconductor memory device according to claim 7, wherein the ON/OFF operation is performed directly after the termination of the program loop.

10. The semiconductor memory device according to claim 7, wherein the control circuit is further configured to perform a single program operation directly after the program loop is completed.

11. The semiconductor memory device according to claim 10, wherein the ON/OFF operation is performed after the single program operation.

12. The semiconductor memory device according to claim 7, wherein the first memory string is a NAND string.

13. A method of controlling a write operation of a semiconductor memory device, the method comprising:
performing a program loop including a program operation and program verification operation executed in series on a first memory cell of a first memory string having a first selection transistor, the first memory cell, a second memory cell, and a second selection transistor connected in series;
after the program loop is completed, applying a first voltage to a first word line connected to a gate of the first memory cell and a second word line connected to a gate of the second memory cell and a second voltage to a first selection gate line connected to a gate of the first selection transistor and a second selection gate line connected to a gate of the second selection transistor, the first voltage being sufficient to turn on the first and second memory cells, the second voltage being sufficient to turn on the first and second selection transistors; and
after the program loop is completed, but before the first voltage has been applied to the first and second word lines, applying a third voltage to a signal line connected to a decoder circuit, and then applying a fourth voltage to the signal line after applying the third voltage, the fourth voltage being lower than the third voltage.

14. The method of claim 13, further comprising:
performing a single program operation outside the program loop directly after the program loop has been completed, then applying a third voltage to a signal line connected to a decoder, and then applying a fourth voltage to the signal line after applying the third voltage, the fourth voltage being lower than the third voltage.

15. The method of claim 13, wherein the program loop terminates once the first memory cell has been verified as having a threshold voltage above a predetermined value corresponding to a data value.

16. The method of claim 13, wherein the first memory string is a NAND string.

* * * * *